United States Patent
Tomita et al.

(10) Patent No.: US 6,218,313 B1
(45) Date of Patent: Apr. 17, 2001

(54) PROCESS FOR PRODUCING SEMICONDUCTOR DEVICE, APPARATUS FOR OPTIMIZING FILM THICKNESS, AND PROCESS FOR OPTIMIZING FILM THICKNESS

(75) Inventors: Manabu Tomita, Kanagawa; Hiroshi Kagotani, Kagoshima, both of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/143,534

(22) Filed: Aug. 28, 1998

(30) Foreign Application Priority Data

Aug. 29, 1997 (JP) .................................................. 9-233521

(51) Int. Cl.[7] .................................................. H01L 21/31
(52) U.S. Cl. ................................ 438/758; 438/7; 438/16; 438/636; 438/427
(58) Field of Search .................................. 438/7, 16, 636, 438/427, 758

(56) References Cited

U.S. PATENT DOCUMENTS

| | | | | |
|---|---|---|---|---|
| 4,203,799 | * | 5/1980 | Sugawara et al. | 156/301 |
| 5,450,205 | * | 9/1995 | Sawin et al. | 356/382 |
| 5,564,830 | * | 10/1996 | Bobel et al. | 374/126 |
| 5,695,556 | * | 12/1997 | Tamamura et al. | 117/85 |
| 5,759,746 | * | 6/1998 | Azuma et al. | 430/313 |
| 5,910,021 | * | 6/1999 | Tabara | 438/636 |

OTHER PUBLICATIONS

Heimann P.A. and Schutz R.J. "Optical Etch–Rate Monitoring: Computer Simulation of Reflactance" Journal of Electrochemical Society, pp. 881–885, Apr. 1984.*

* cited by examiner

Primary Examiner—Matthew Smith
Assistant Examiner—Renzo N. Rocchegiani
(74) Attorney, Agent, or Firm—Ronald P. Kananen; Rader, Fishman & Grauer

(57) ABSTRACT

A process for producing a semiconductor device and an apparatus and a process for obtaining an optimum film thickness, the process for producing a semiconductor device comprising forming a film of a light reflecting material on a semiconductor substrate; coating a positive resist on the film of a light reflecting material; forming a resist pattern from the positive resist; and etching the film of a light reflecting material using the resist pattern as a mask, wherein simulation of light intensity is conducted by using optical constants of the semiconductor substrate, the film of a light reflecting material and the resist obtained by measuring the optical constants thereof, or when optical constants thereof are known, by using the known optical constants, with varying a film thickness of the film of a light reflecting material to plural values, so as to obtain a film thickness of the film of a light reflecting material that makes a light absorption energy at an interface between the film of a light reflecting material and the resist minimum; and the film thickness of the film of a light reflecting material is set to the film thickness thus-obtained.

5 Claims, 10 Drawing Sheets

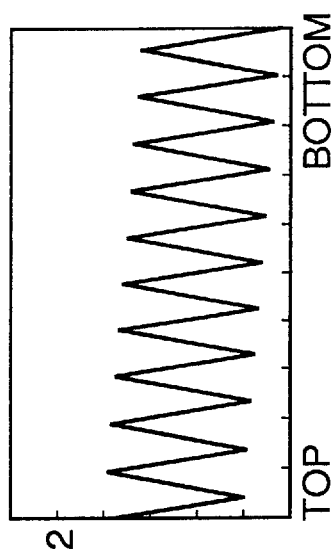
FIG.4A-3
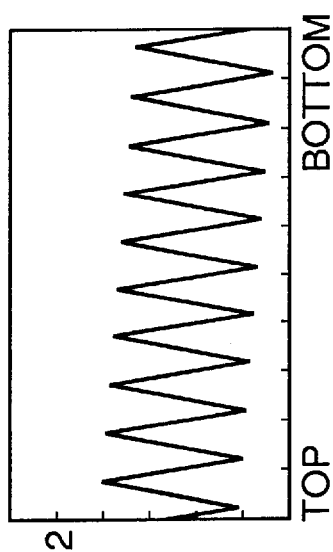
FIG.4A-2
FIG.4A-1
STANDING WAVE
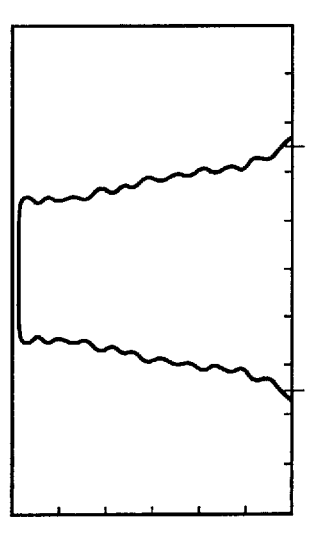
FIG.4B-3
FILM THICKNESS:195 nm
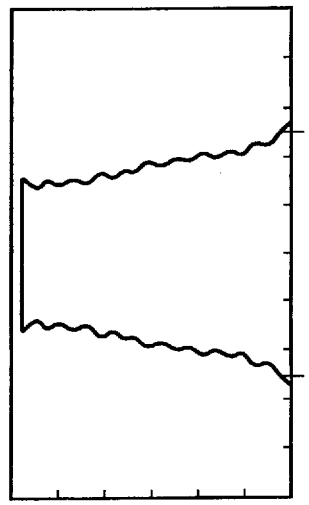
FIG.4B-2
FILM THICKNESS:190 nm
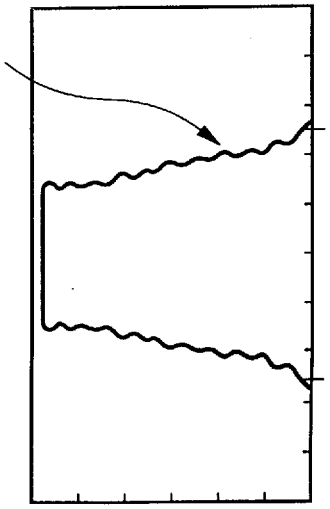
FIG.4B-1
RESIST PROFILE
FILM THICKNESS:185 nm

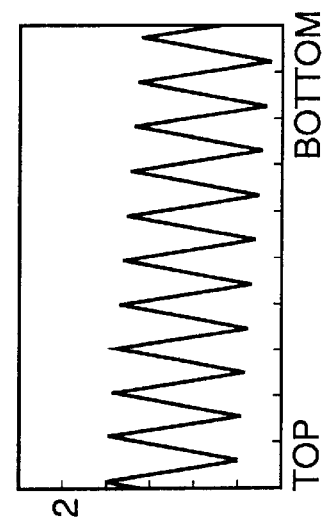
FIG.5A-3
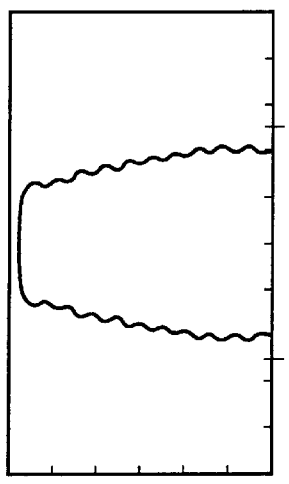
FIG.5B-3 FILM THICKNESS: 210 nm
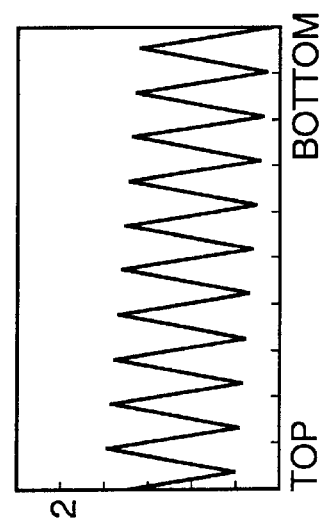
FIG.5A-2
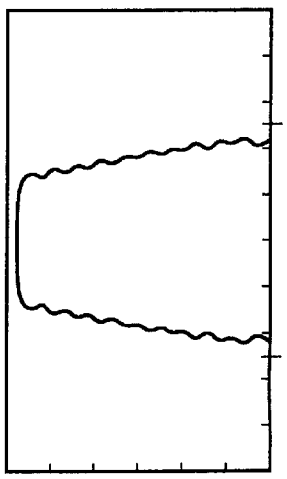
FIG.5B-2 FILM THICKNESS: 205 nm
FIG.5A-1 STANDING WAVE
FIG.5B-1 RESIST PROFILE FILM THICKNESS: 200 nm
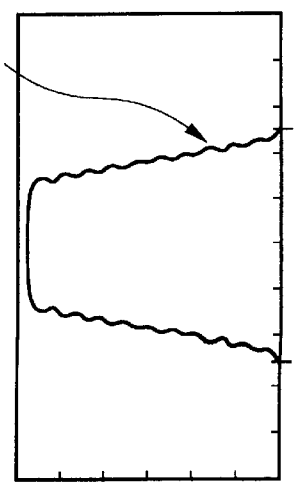

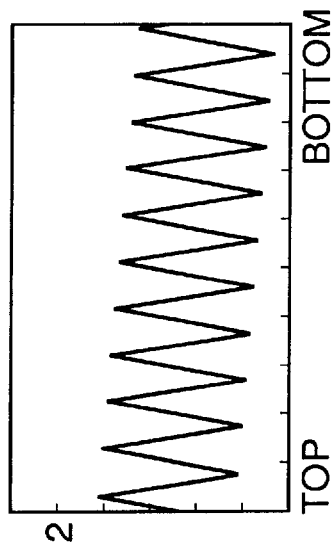 FIG.6A-1 STANDING WAVE (TOP / BOTTOM)
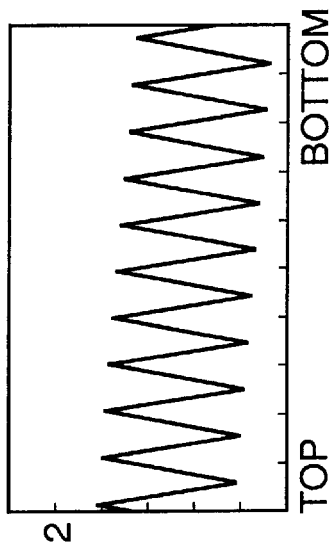 FIG.6A-2 (TOP / BOTTOM)
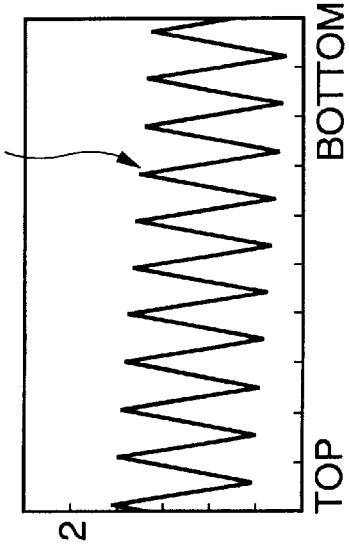 FIG.6A-3 (TOP / BOTTOM)
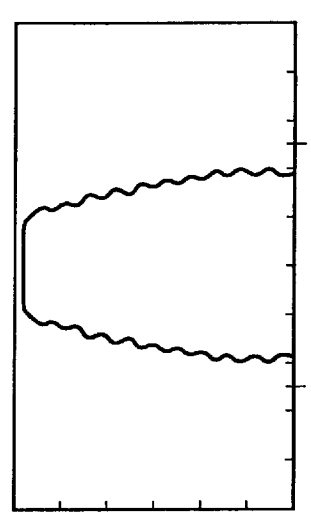 FIG.6B-1 RESIST PROFILE — FILM THICKNESS: 215 nm
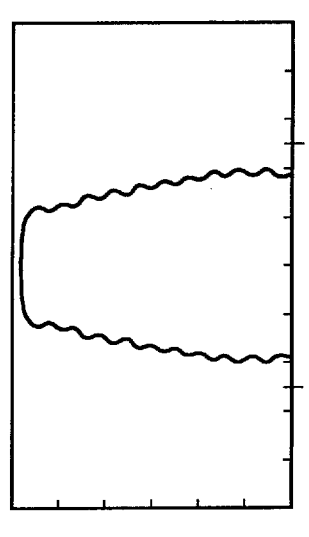 FIG.6B-2 FILM THICKNESS: 220 nm
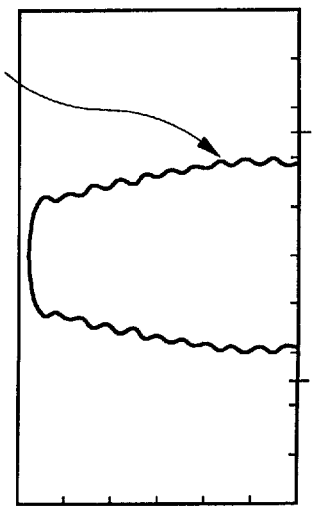 FIG.6B-3 FILM THICKNESS: 225 nm

PROCESS FOR PRODUCING SEMICONDUCTOR DEVICE, APPARATUS FOR OPTIMIZING FILM THICKNESS, AND PROCESS FOR OPTIMIZING FILM THICKNESS

FIELD OF THE INVENTION

The present invention relates to a process for producing a semiconductor device comprising forming a film of a light reflecting material on a semiconductor substrate, coating a resist on the film of a light reflecting material, forming a resist pattern with the resist, and etching the film of a light reflecting material using the resist pattern as a mask, and an apparatus and a process for obtaining an optimum film thickness of the film of a light reflecting material in the production process.

BACKGROUND OF THE INVENTION

Upon production of a semiconductor device, there is generally an intermediate layer between an Si substrate and a resist. In the case where a MOS transistor is produced, for example, on patterning a resist for forming an element separating layer as the first step, an oxide film has been formed under the resist. Accordingly, as shown in FIG. 1A, in the case where a resist layer 2 (positive type in this example) is formed on an Si substrate 1, intermediate layers 3a, 3b and 3c of $SiO_2$ and $Si_3N_4$ has been formed on the Si substrate 1.

In the case where the intermediate layer 3a does not reflect or transmit light but does completely absorb light as in FIG. 1A, the intermediate layer 3a does not give any influence on the shape of the resist layer 2 as an upper layer after patterning, i.e., the shape of a resist pattern 2a as shown in FIG. 1B.

On the other hand, in the case of the intermediate layers 3b and 3c reflecting light, the reflected light returns to the resist layer 2 to interfere with the incident light, i.e., the so-called standing wave effect occurs. Because of the presence of the intermediate layer 3b (or 3c), interference of a mixture of the optical constants n and k and the film thickness of the intermediate layer 3b (or 3c) occurs, as different from the simple standing wave of only the Si substrate 1 and the resist layer 2. The optical constant n is the real part of the reflective index, i.e., the ratio of the light velocity in vacuo and the light velocity in the substance at issue. The optical constant k is the imaginary part of the reflective index, which is determined by the light absorption coefficient α of the substance at issue (represented by $4\pi\alpha/\lambda$ where λ represents the wavelength).

Accordingly, as shown by B in FIG. 1B, a broad slope called "tailing" is formed at the boundary between the resist pattern 2b formed by patterning by exposure and development and the intermediate layer 3b under the resist pattern, and also as shown by C in FIG. 1B, a scooping called "undercut" is formed at the boundary between the resist pattern 2c and the intermediate layer 3c under the resist pattern.

When the tailing occurs, the tailing part functions as a mask on etching the intermediate layer 3b using the resist pattern 2b as a mask, and the intermediate layer 3b positioned under the tailing part is not sufficiently etched. As a result, the line width under the resist after etching is thickened.

On the other hand, when the undercut occurs, stress concentration occurs at the undercut part by the surface tension on the development of the resist pattern 2c, and the resist pattern 2c is collapsed as in the worst case. Even when the undercut does not proceed to bring about the collapse of the resist pattern, etching at the undercut part excessively proceeds.

When the tailing or the undercut occurs uniformly within the surface of the Si substrate 1, it is possible to determine the line width of the resist taking the change of the line width on etching into consideration, but in the practical device, the tailing or the undercut does not occur uniformly.

The intermediate layers 3b and 3c is formed by a film forming process, such as the CVD process, the spattering process and the spin coating process. An apparatus for producing a semiconductor device conducting such film forming processed is recently improved in its performance, and the uniformity of the thickness and the optical characteristics of the film produced by the processes is greatly improved than those in former times.

However, a slight fluctuation (unevenness) still remains even in the film forming process of such an apparatus for producing a semiconductor device, and the unevenness in the film thickness and the optical characteristics of the film cannot be completely removed.

In the case of a structure comprising a resist layer, an SiN layer (intermediate layer) and an Si substrate in this order, for example, when the thickness of the SiN layer changes to as small as 0.02 μm, the shape of the resist pattern obtained by patterning changes from the tailing to the undercut. Accordingly, due to the slight fluctuation of the thickness of the SiN layer (intermediate layer), the resist pattern is collapsed or a bridge (resist remains in a part which is planned as the resist should not remain) is produced in a space of the pattern.

Results of the simulation when the tailing occurs in the resist pattern are shown in FIGS. 2A-1 and 2A-2, and results of the simulation where the undercut occurs are shown in FIGS. 2B-1 and 2B-2. These figures of simulation show examples of an Si substrate, an SiN layer (intermediate layer) and the resist layer in this order from the bottom, where a positive resist is used as the resist. Therefore, the part that remains as horizontally protrudes (in a convex state) in FIGS. 2A-2 and 2B-2 is an unexposed part where light is not irradiated since the resist is a positive type.

In the case of the tailing mode in FIGS. 2A-1 and 2A-2, the light absorption energy at the interface between the resist and the SiN layer (intermediate layer) becomes small as shown in FIG. 2A-1. Therefore, in the PEB (post exposure bake) process where an acid is produced by baking after exposure to change the development rate, since the amount of an acid produced at the interface between the resist and the SiN layer (intermediate layer) becomes small, the dissolution rate is decreased, and the bottom of the resist remains as tailing shown in FIG. 2A-2.

In the case of undercut, on the other hand, since the light absorption energy at the interface between the resist and the SiN layer (intermediate layer) becomes the maximum, a large amount of an acid is generated by the PEB process to raise the dissolution rate, and thus the undercut occurs.

In a simple model composed of a substrate and a resist formed directly on the substrate, the shape of the resist pattern can be controlled by adjusting the film thickness of the resist.

However, in the case where the optical constants $n_1$ and $k_1$ of the intermediate layer formed under the resist layer is larger than the optical constants $n_2$ and $k_2$ of the resist layer, the shape of the resist pattern obtained by patterning is predominantly influenced by the film thickness of the intermediate layer. Therefore, the film thickness of the intermediate layer positioned under the resist film must be optimized to stably obtain a resist pattern having a desired shape.

Under the circumstances, it has been conventionally practiced that in order to conduct the optimization of the film thickness of the intermediate layer, plural samples having film thickness values different from each other are prepared, and an exposure experiment is actually conducted to determine the optimum film thickness.

However, this method involves a disadvantage in that large amounts of time and cost are required to prepare the plural samples.

SUMMARY OF THE INVENTION

The present invention has been developed in view of the above described circumstances.

An object of the invention is to provide a process for producing a semiconductor device, an apparatus for optimizing a film thickness and a process for optimizing a film thickness, in that a thickness of a film of a light reflection material formed under a resist is optimized, and the optimization can be conducted in a short period of time without a large amount of cost, so as to stably form a resist pattern having a desired shape.

The object can be accomplished by one aspect of the process for producing a semiconductor device according to the invention, which comprises forming a film of a light reflecting material on a semiconductor substrate; coating a positive resist or a negative resist on the film of a light reflecting material; forming a resist pattern from the positive resist or the negative resist; and etching the film of a light reflecting material using the resist pattern as a mask, wherein simulation of light intensity is conducted by using optical constants of the semiconductor substrate, the film of a light reflecting material and the resist obtained by measuring the optical constants thereof, or when optical constants thereof are known, by using the known optical constants, with varying a film thickness of the film of a light reflecting material to plural values, so as to obtain a film thickness of the film of a light reflecting material that makes a light absorption energy at an interface between the film of a light reflecting material and the resist minimum or maximum; and the film thickness of the film of a light reflecting material is set to the thus-obtained film thickness.

According to this production process, because the film thickness is obtained under the conditions corresponding to the species of the resist by conducting simulation of light intensity by using the optical constants of the semiconductor substrate, the film of a light reflecting material and the resist, with varying the film thickness of the film of a light reflecting material to plural values, and the film thickness of the film of a light reflecting material to the thus-obtained film thickness, a desired shape of the resist pattern can stably obtained by optimizing the film thickness of the film of a light reflecting material by the simulation of light intensity. Furthermore, because the optimization of the film thickness of the film of a light reflecting material is conducted by the simulation of light intensity, the optimization can be conducted in a short period of time without a large amount of cost.

The object can also be accomplished by another aspect of the process for producing a semiconductor device according to the invention, which comprises forming a film of a light reflecting material on a semiconductor substrate; coating a resist on the film of a light reflecting material; forming a resist pattern from the resist; and etching the film of a light reflecting material using the resist pattern as a mask, wherein simulation of light intensity is conducted by using optical constants of the semiconductor substrate, the film of a light reflecting material and the resist obtained by measuring the optical constants thereof, or when optical constants thereof are known, by using the known optical constants, with varying a film thickness of the film of a light reflecting material to plural values, and simulation of development is conducted; a film thickness of the film of a light reflecting material, at which a line width of the resist at an interface between the film of a light reflecting material and the resist becomes a median of a minimum value and a maximum value, is obtained from a result of the simulation of development; and the film thickness of the film of a light reflecting material is set to the thus-obtained film thickness.

According to this production process, because the film thickness is obtained by conducting simulation of light intensity by using the optical constants of the semiconductor substrate, the film of a light reflecting material and the resist, with varying the film thickness of the film of a light reflecting material to plural values, and by conducting simulation of development, and the film thickness of the film of a light reflecting material is obtained from a result of the simulation of development to set the film thickness of the film of a light reflecting material to the thus-obtained film thickness, a desired shape of the resist pattern can stably obtained by optimizing the film thickness of the film of a light reflecting material by the simulation of light intensity. Furthermore, because the optimization of the film thickness of the film of a light reflecting material is conducted by the simulation of light intensity, the optimization can be conducted in a short period of time without a large amount of cost.

The object can also be accomplished by one aspect of the apparatus for optimizing a film thickness according to the invention, which comprises an optical constant measuring device for measuring optical constants of a semiconductor substrate, a film of a light reflecting material formed on the semiconductor substrate, and a resist coated on the film of a light reflecting material; a light intensity simulation device conducting simulation of light intensity by using optical constants obtained by the optical constant measuring device, with varying a film thickness of the film of a light reflecting material to plural values; and a film thickness determination device obtaining an optimum film thickness of the film of a light reflecting material from a result of simulation by the light intensity simulation device.

According to this apparatus for optimizing a film thickness, it is possible to conduct simulation of light intensity by the light intensity simulation device using the optical constants of the semiconductor substrate, the film of a light reflecting material and the resist obtained by the optical constant measuring device, with varying the film thickness of the film of a light reflecting material to plural values, and to obtain the optimum film thickness of the film of a light reflecting material by the film thickness determination device from the result of simulation by the light intensity simulation device. Therefore, the film of a light reflecting material having the optimum film thickness can be produced advantageously from the standpoint of time and cost.

The object can also be accomplished by one aspect of the process for optimizing a film thickness according to the invention, which comprises measuring optical constants of a semiconductor substrate, a film of a light reflecting material formed on the semiconductor substrate and a resist coated on the film of a light reflecting material; conducting simulation of light intensity using the optical constants obtained, with varying a film thickness of the film of a light reflecting material to plural values; and obtaining an optimum film thickness of the film of a light reflecting material from a result of the simulation of light intensity.

According to this process for optimizing a film thickness, because the optimum film thickness of the film of a light reflecting material is obtained from the result of the simulation, the film of a light reflecting material having the optimum film thickness can be produced advantageously from the standpoint of time and cost.

The object can also be accomplished by another aspect of the apparatus for optimizing a film thickness according to the invention, which comprises an optical constant measuring device for measuring optical constants of a semiconductor substrate, a film of a light reflecting material formed on the semiconductor substrate, and a resist coated on the film of a light reflecting material; a light intensity simulation device conducting simulation of light intensity by using optical constants obtained by the optical constant measuring device, with varying a film thickness of the film of a light reflecting material to plural values; a development simulation device conducting simulation of development by using a result of simulation by the light intensity simulation device; and a line width measuring device obtaining a line width of the resist at an interface between the film of a light reflecting material and the resist from a result of simulation by the development simulation device.

According to this apparatus for optimizing a film thickness, it is possible to conduct simulation of light intensity by the light intensity simulation device using the optical constants of the semiconductor substrate, the film of a light reflecting material and the resist obtained by the optical constant measuring device, with varying the film thickness of the film of a light reflecting material to plural values; to conduct simulation of development by the development simulation device from the result of simulation by the light intensity simulation device; to obtain the line width by the line width measuring device from the result of simulation by the development simulation device; and to obtain the optimum film thickness of the film of a light reflecting material. Therefore, the film of a light reflecting material having the optimum film thickness can be produced advantageously from the standpoint of time and cost.

The object can also be accomplished by another aspect of the process for optimizing a film thickness according to the invention, which comprises measuring optical constants of a semiconductor substrate, a film of a light reflecting material formed on the semiconductor substrate and a resist coated on the film of a light reflecting material; conducting simulation of light intensity using the optical constants obtained, with varying a film thickness of the film of a light reflecting material to plural values; conducting simulation of development using a result of the simulation of light intensity; and obtaining an optimum film thickness of the film of a light reflecting material from a result of the simulation of development.

According to this process for optimizing a film thickness, because the optimum film thickness of the film of a light reflecting material is obtained from the result of the simulation of development, the film of a light reflecting material having the optimum film thickness can be produced advantageously from the standpoint of time and cost.

BRIEF DESCRIPTION OF THE DRAWINGS

FIGS. 2A-1 and 2B-1 are graphs showing simulation results of the standing wave, and FIGS. 2A-2 and 2B-2 are graphs showing simulation results of the resist pattern (resist profile).

FIGS. 4A-1 through 4B-3 are graphs showing results of simulation of light intensity, where FIGS. 4A-1, 4A-2 and 4A-3 are graphs showing simulation results of the standing wave, and FIGS. 4B-1, 4B-2 and 4B-3 are graphs showing simulation results of the resist pattern (resist profile).

FIGS. 5A-1 through 5B-3 are graphs showing results of simulation of light intensity, where FIGS. 5A-1, 5A-2 and 5A-3 are graphs showing simulation results of the standing wave, and FIGS. 5B-1, 5B-2 and 5B-3 are graphs showing simulation results of the resist pattern (resist profile).

FIGS. 6A-1 through 6B-3 are graphs showing results of simulation of light intensity, where FIGS. 6A-1, 6A-2 and 6A-3 are graphs showing simulation results of the standing wave, and FIGS. 6B-1, 6B-2 and 6B-3 are graphs showing simulation results of the resist pattern (resist profile).

FIGS. 7A-1 through 7B-3 are graphs showing results of simulation of light intensity, where FIGS. 7A-1, 7A-2 and 7A-3 are graphs showing simulation results of the standing wave, and FIGS. 7B-1, 7B-2 and 7B-3 are graphs showing simulation results of the resist pattern (resist profile).

DETAILED DESCRIPTION OF THE PREFERRED EMBODIMENTS

The invention will be described in more detail with reference to the following embodiments.

EMBODIMENT 1

In this embodiment, the process for producing a semiconductor device of the invention is applied to formation of an element separation structure of a MOS transistor.

Figure 3A:
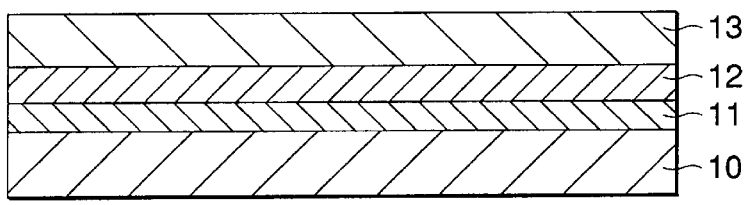
FIGS. 3A through 3D are schematic diagrams of cross sectional views of important parts in the case where the process for producing a semiconductor device of the invention is applied to the production of a MOS transistor.

Accordingly, in this embodiment shown in FIG. 3A, an $SiO_2$ film 11 is formed for element separation on an Si substrate (semiconductor substrate) 10. The $SiO_2$ film 11 will be grown as an element separation layer. An $Si_3N_4$ (silicon nitride, hereinafter abbreviated "SiN") film 12 as the film of a light reflecting material in the invention is then formed by a CVD process, and a positive resist layer 13 is formed by coating a positive resist on the SiN film 12.

Figure 3B:
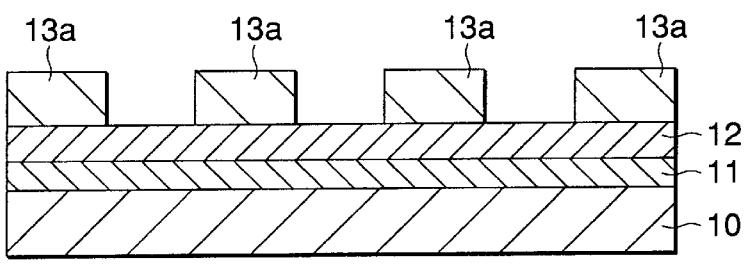
Figure 3C:
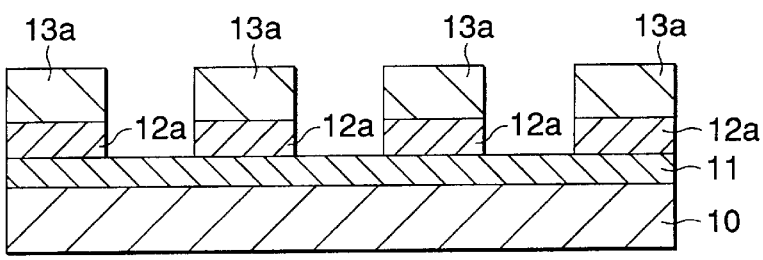

A mask pattern is transferred to the positive resist layer 13, and PEB and development are conducted in this order, to form a resist pattern 13a as shown in FIG. 3B. The SiN film 12 is etched using the resist pattern 13a as a mask, to form an SiN pattern 12a as shown in FIG. 3C.

Figure 3D:
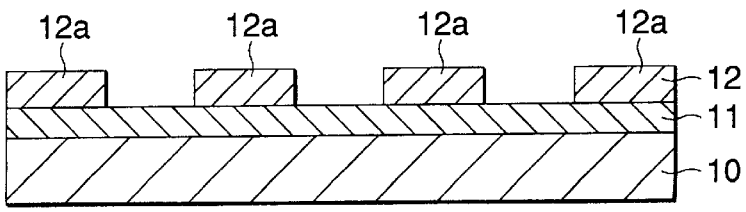
Figures 3, 7A:
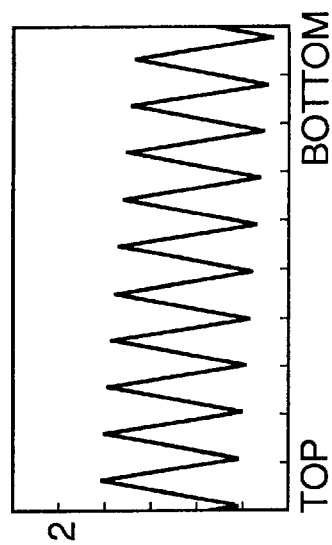
Figures 3, 7B:
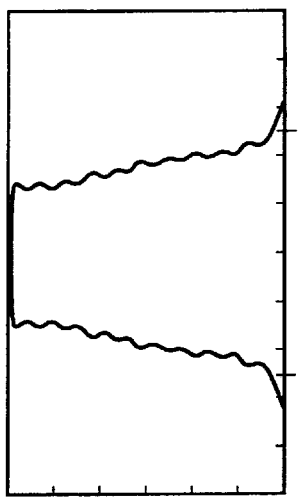
Figures 2, 7A:
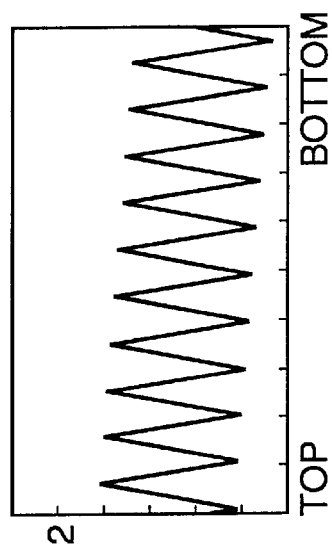
Figures 2, 7B:
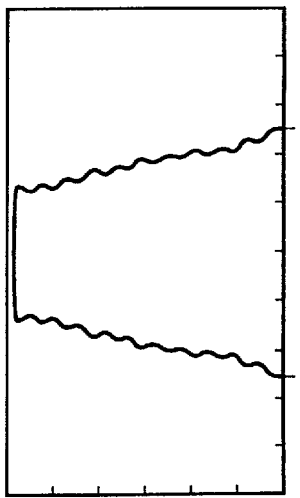
Figures 1, 7A:
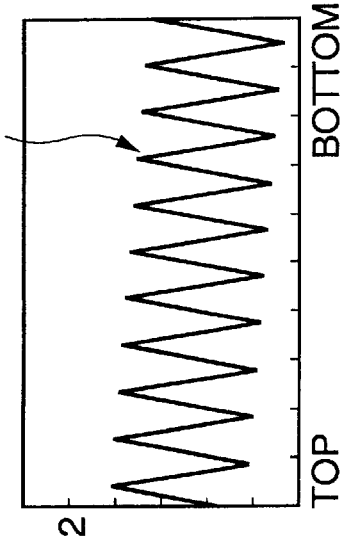
Figures 1, 7B:
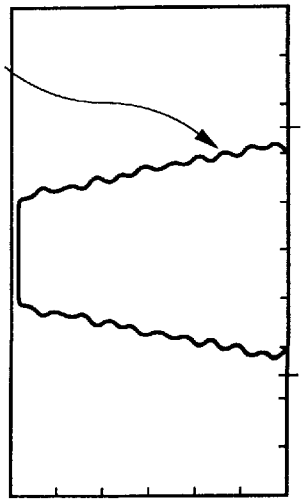

The resist pattern 13a is then removed, and parts of the SiO₂ film 11, at which the SiN pattern 12a is not present, are grown, to form the element separation structure as shown in FIG. 3D.

When the positive resist layer 13 is exposed on patterning the positive resist layer 13 in the formation process of the element separation structure, the fluctuation of the film thickness of the SiN film 12 as an underlayer becomes a problem as described above. That is, because of unevenness within a wafer of the Si substrate 10 and unevenness among wafers of the Si substrate 10, when the setting of the film thickness of the SiN layer 12 in the initial stage of the process is failed, there is a possibility that the resist pattern 13a is collapsed or a large extent of tailing occurs.

In this embodiment, the film thickness of the SiN film 12 is determined as follows before the formation of the SiN film 12.

Simulation of light intensity and simulation of development are conducted by using optical constants (n and k) of the Si substrate 10, the SiO₂ film 11, the SiN film 12 and the positive resist layer 13, the thickness of SiO₂ film 11 of 10 nm, and the thickness of the positive resist film 13 of 0.73 $\mu$m, with varying the thickness of the SiN film 12 from 185 to 240 nm at a step of 5 nm. The simulation is conducted with an assumption that an anti-reflection film having a thickness of 43 $\mu$m is formed on the positive resist layer 13.

Results of the simulation of light intensity are shown in FIGS. 4A-1 to 4A-3, 4B-1 to 4B-3, 5A-1 to 5A-3, 5B-1 to 5B-3, 6A-1 to 6A-3, 6B-1 to 6B-3, 7A-1 to 7A-3 and 7B-1 to 7B-3. The series of the figures mentioned with a letter "A" (such as 4A-1, 5A-2, etc.) each is a graph showing the light absorption energy from the top to the bottom of the positive resist layer 13, which shows a result of simulation of standing wave. The series of the figures mentioned with a letter "B" (such as 4B-1, 5B-2, etc.) each is a graph showing a result of development (resist profile) of the resist pattern 13a which is obtained by the light absorption energy from the top to the bottom of the positive resist layer 13 when the positive resist layer 13 is developed.

The simulation of light intensity and the simulation of development are conducted by using a commercially available simulation program ("PROLITE 3D", a trade name).

Figure 1A:
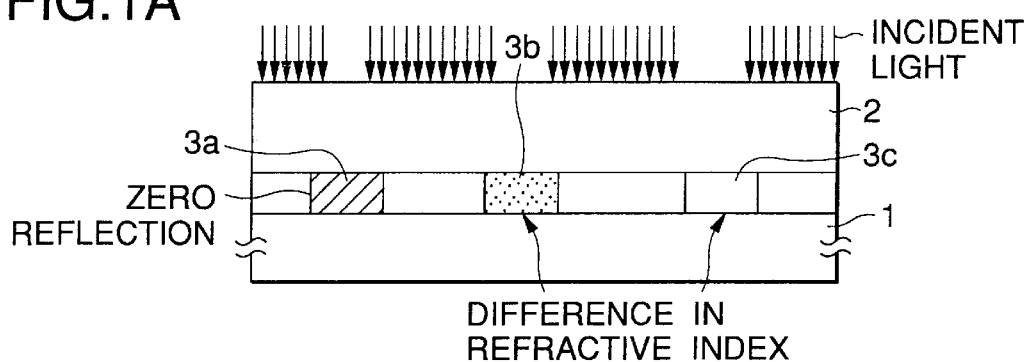
FIGS. 1A and 1B are schematic diagrams of cross sectional views for explaining the patterning of a resist layer.
Figure 1B:
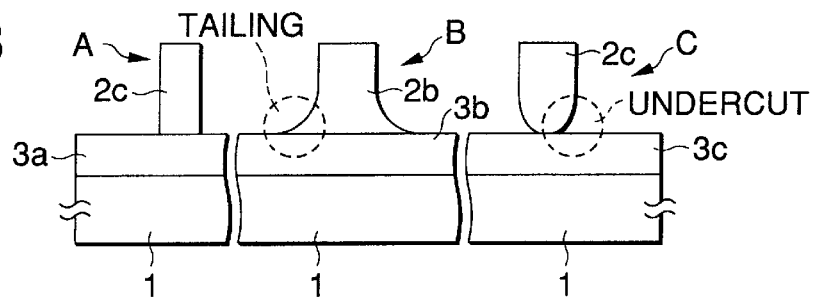
Figures 1, 2A:
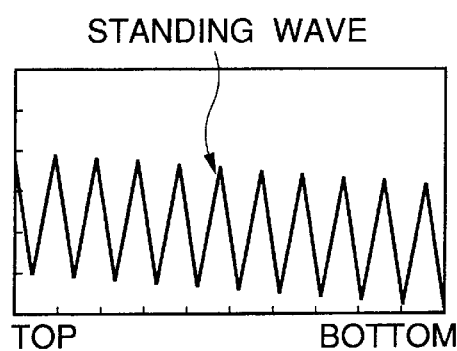
FIGS. 2A-1 through 2B-2 are graphs showing results of simulation of light intensity, where
Figures 1, 2B:
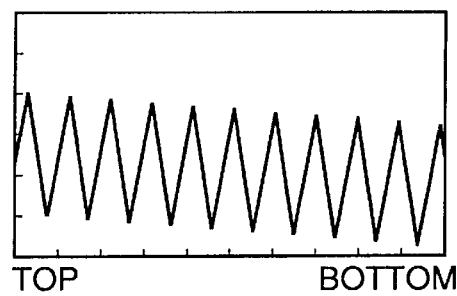
Figures 2, 2A:
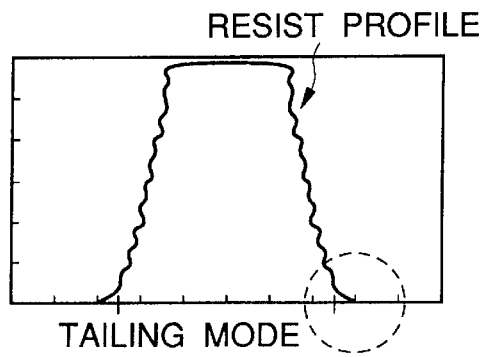
Figures 2, 2B:
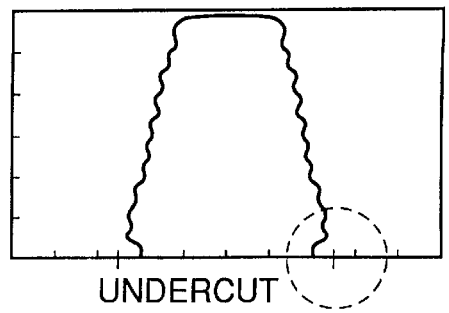

From comparison of the series of figures mentioned with a letter "A" among FIGS. 4A-1 through 7B-3, when the film thickness of the SiN film 12 is about 200 nm in FIG. 5A-1, the light absorption energy at the interface between the SiN film 12 (film of a light reflecting material) and the positive resist layer 13 (resist pattern 13a), i.e., at the bottom of the positive resist layer 13, becomes the minimum. Therefore, the SiN film 12 can be produced to have the film thickness that has been previously obtained herein (200 nm).

It is understood from comparison of FIGS. 4A-1 through 7B-3 that the shape of the standing wave and the shape of the resist pattern 13a in the case where the film thickness of the SiN film 12 is 185 nm are the same as those in the case where the case where the film thickness of the SiN film 12 is 240 nm. That is, there is a period of 55 nm in film thickness.

It is understood from the series of figures mentioned with a letter "B" among FIGS. 4A-1 through 7B-3 that in this embodiment, when the film thickness of the SiN film 12 is 215 nm, a large undercut occurs in the resist pattern 13a, and there is a possibility of collapsing the resist pattern 13a. When the film thickness is 185 nm, on the other hand, a large tailing occurs. With an assumption that the unevenness of the film formation by the CVD apparatus is ±12 nm, the optimum film thickness of the SiN film 12 is 200 nm as described above.

Then, an SiO₂ film 11 having a film thickness of about from 10 to 20 nm was formed on an Si substrate 10, and an SiN film 12 having a thickness of 200 nm was formed. The SiN film 12 was subjected to a general surface treatment, and a positive resist of a chemical sensitization type was coated to form a positive resist layer 13.

The positive resist layer 13 was pre-baked and then exposed by a demagnification projection aligner. The exposed resist layer 13 was subjected to baking to generate an acid, and development was conducted to form a resist pattern 13a.

As a result of observation by a scanning electron microscope of the thus formed resist pattern 13a, there was no tailing or collapse.

By obtaining the film thickness of the SiN film 12 where the light absorption energy at the bottom of the positive resist layer 13 becomes the minimum by conducting simulation of light intensity, and forming the SiN film 12 (film of a light reflecting material) having that film thickness, a resist pattern 13a having a shape without tailing or undercut can be stably formed on the SiN film 12. Because the optimum film thickness of the SiN film 12 (film of a light reflecting material) is obtained by the simulation of light intensity, the determination (setting) of the optimum film thickness can be conducted in a short period of time with a low cost, and improvement in productivity and reduction in production cost can be realized.

While the case of a resist of a positive type (positive resist) has been described in this embodiment, the invention is not construed as being limited thereto, and a resist of a negative type (negative resist) can be used. In that case, the film thickness where the light absorption energy at the bottom of the negative resist layer becomes the minimum is obtained, and the SiN film (film of a light reflecting material) having that thickness is formed.

In this embodiment, when the optical constants (n and k) of the Si substrate 10, the SiO₂ film 11, the SiN film 12 and the positive resist layer 13 are known, the known values can be used. When they are not known, they must be previously measured. In the invention, the optical constants of these materials are measured by a known spectral ellipsometer (optical constant measuring device).

Even in the case of materials that are not generally used, their optical constants can be previously measured by using a spectral ellipsometer (optical constant measuring device), and the optimum film thickness of the film of a light reflecting material can be obtained from the measured values.

In this embodiment, the film thickness where the light absorption energy at the bottom of the positive resist layer 13 becomes the minimum is obtained by the simulation of light intensity. However, depending on the species of the resist, for example, in the case of a resist where the resist may be collapsed after patterning, the simulation of development is conducted, and the line width at the bottom of the resist pattern (resist profile) obtained by the simulation, as shown in the series of figures mentioned with a letter "B" among FIGS. 4A-1 through 7B-3. Then, the film thickness at which the line width becomes the median within the one period described above is determined as the optimum film thickness.

In the case where the optimization of the film thickness of the film of a light reflecting material is conducted by the simulation of development, the desired shape of the resist pattern can be stably formed, and the optimization can be conducted in a short period of time with a low cost.

EMBODIMENT 2

The apparatus for optimizing a film thickness according to one embodiment of the invention is described below.

Figure 8:
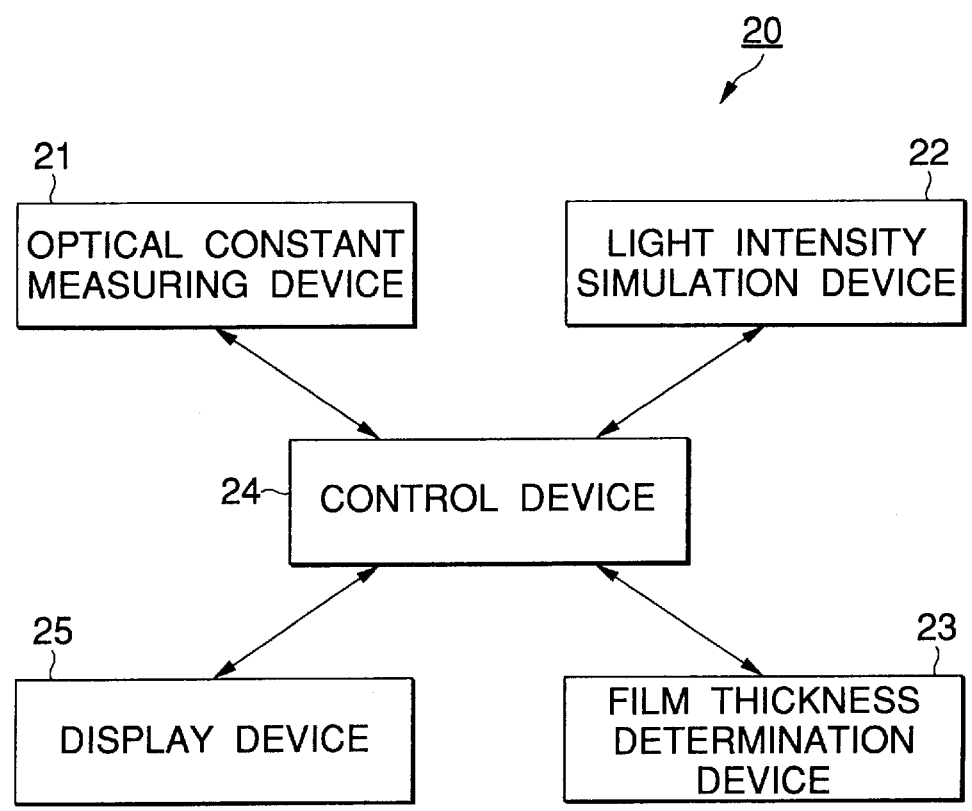
FIG. 8 is a block diagram showing one embodiment of the apparatus for optimizing a film thickness according to the invention.

FIG. 8 is a block diagram showing one embodiment of the apparatus for optimizing a film thickness according to the invention, where numeral 20 denotes the apparatus for optimizing a film thickness. The apparatus for optimizing a film thickness 20 comprises an optical constant measuring device 21 for measuring, for example, optical constants of the Si substrate 10, the $SiO_2$ film 11 on the Si substrate 10, the SiN film (film of a light reflecting material) 12 and the positive resist layer 13 on the SiN film 12 shown in FIGS. 3A through 3D; a light intensity simulation device 22 conducting simulation of light intensity by using the optical constants obtained by the optical constant measuring device 21, with varying the film thickness of the SiN film (film of a light reflecting material) 12 to plural values; a film thickness determination device 23 obtaining the optimum film thickness of the film of a light reflecting material from the result of the simulation by the light intensity simulation device 22; a control device 24 controlling the devices 21, 22 and 23; and a display device 25 displaying measurement results of the devices.

The optical constant measuring device 21 comprises the spectral ellipsometer, and the light intensity simulation device 22 comprises a computer using the simulation program ("PROLITE 3D", a trade name). The control device 24 comprises a host computer electrically connected to the optical constant measuring device 21 and the light intensity simulation device 22, and the display device 25 comprises a CRT display or a liquid crystal display connected to the control device 24. The film thickness determination device 23 comprises a computer using a program for obtaining the film thickness where the light absorption energy at the interface between the SiN film (film of a light reflecting material) 12 and the positive resist layer 13 becomes the minimum, from the result of the simulation of light intensity obtained by the light intensity simulation device 22 as described in Embodiment 1.

Figure 9:
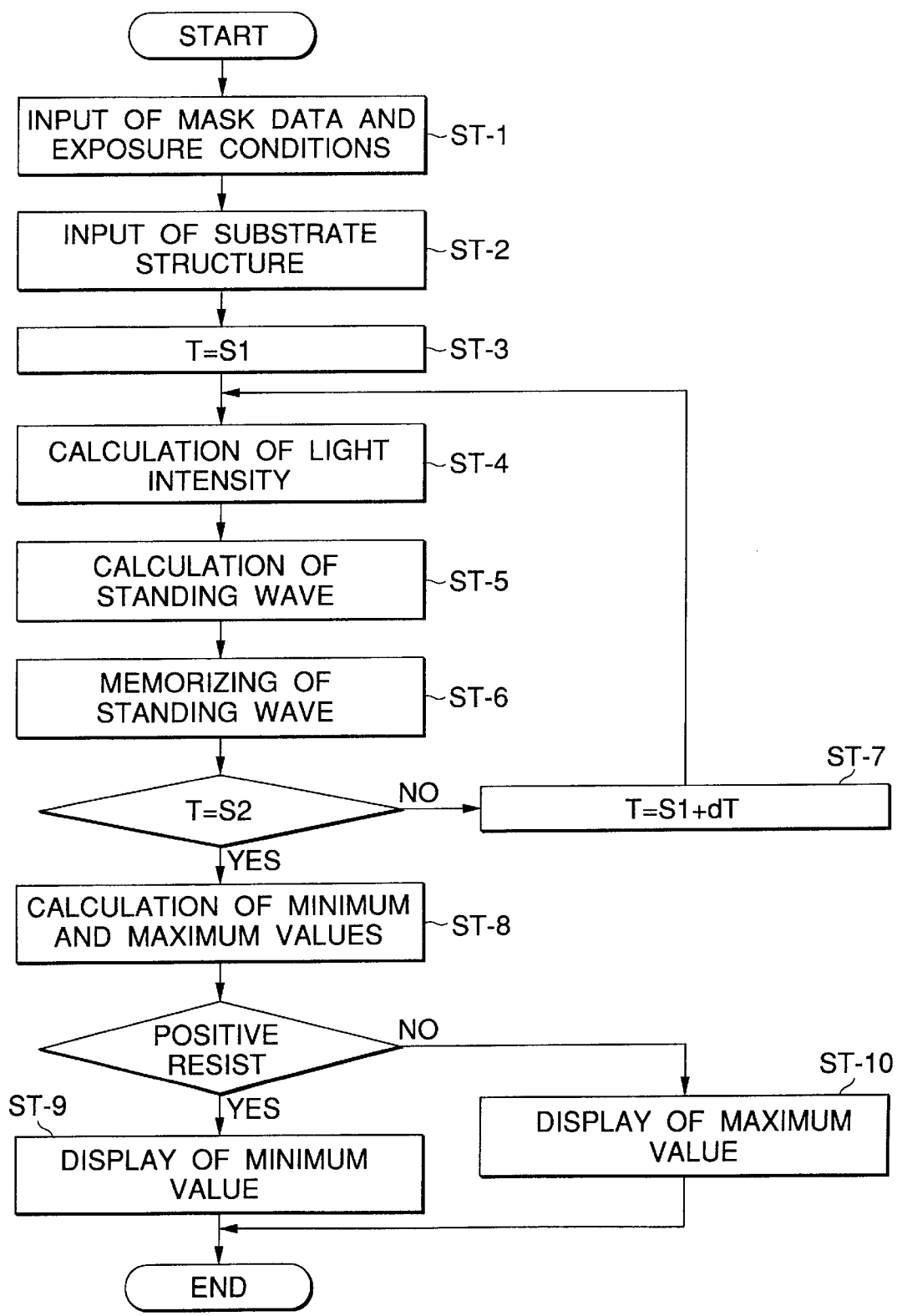
FIG. 9 is a flow diagram for explaining one embodiment of the process for optimizing a film thickness according to the invention using the apparatus for optimizing a film thickness shown in FIG. 8.

Based on the constitution of the apparatus for optimizing a film thickness 20, one embodiment of the process for optimizing a film thickness of the invention is described by referring to the flow diagram of FIG. 9.

The mask data and exposure conditions (wavelength of light, NA and σ) for patterning the positive resist layer 13 are newly inputted to the light intensity simulation device 22, or selected from the data previously prepared to input to the light intensity simulation device 22 (Step 1, mentioned as ST-1 hereinafter).

The structure of the substrate to be calculated is inputted to the light intensity simulation device 22 (ST-2). As the data inputted, the names of the materials, the optical constants and the film thicknesses of the Si substrate 10, the $SiO_2$ film 11, the SiN film 12 and the positive resist layer 13 are inputted in the order of stacking.

For the material, the optical constants of which is not known, they are previously measured by the optical constant measuring device 21, and the resulting measured values are inputted to the light intensity simulation device 22.

With respect to the film thickness T of the SiN film (film of a light reflecting material) 12 directly under the positive resist layer 13, an arbitrary value, for example the minimum value of the film thickness that has been empirically employed, is used as the initial value S1, and the maximum value thereof is used as the final value S2. The increment value between S1 and S2 is designated dT, and the initial value S1, the final value S2 and the increment value dT are inputted to the optical intensity simulation device 22.

On inputting the initial value S1, the final value S2 and the increment value dT, it is preferred that the total tendency of the simulation is firstly observed by making the step rough, i.e., using a relatively large value for dT, and then the final simulation is conducted by changing dT to a smaller value. Even though the simulation is thus repeated, the advantage in time is not impaired in comparison to the case where an experiment is actually conducted because the simulation itself can be conducted in a short period of time.

After inputting the values, the film thickness T is set to S1 in the light intensity simulation device 22 (ST-3), and the calculation of the light intensity (ST-4) and the calculation of the standing wave (ST-5) are conducted in this order by using the set value. The resulting values are then memorized (ST-6).

In the case where the film thickness T set in ST-3 is different from the final value S2, the increment value dT is added to the set value (ST-7) to obtain a new set value, and the calculation of the light intensity (ST-4), the calculation of the standing wave (ST-5) and the memorizing of the results (ST-6) are conducted using the new set value.

ST-4, ST-5 and ST-6 are repeated until the film thickness T agrees with the final value S2, and after agreeing therewith, the minimum value and the maximum value of the light absorption energy at the interface between the SiN film 12 (film of a light reflecting material) and the positive resist layer 13 (resist pattern 13a), i.e., at the bottom of the positive resist layer 13, in the standing wave memorized in ST-6 are obtained (ST-8). The type of the resist is obtained from the inputted data of the resist, and when the resist is a positive type, the film thickness Tmin where the light absorption energy is the minimum is obtained and displayed (ST-9), whereas when it is a negative type, the film thickness Tmax where the light absorption energy is the maximum is obtained and displayed (ST-10), followed by completing the simulation of light intensity.

In the case where the range between S1 and S2 is too broad, the data oversteps the period to form plural extreme values, i.e., a plurality of the minimum values and the maximum values. In such a case, all the values are memorized and displayed.

EMBODIMENT 3

The apparatus for optimizing a film thickness according to another embodiment of the invention is described below.

Figure 10:
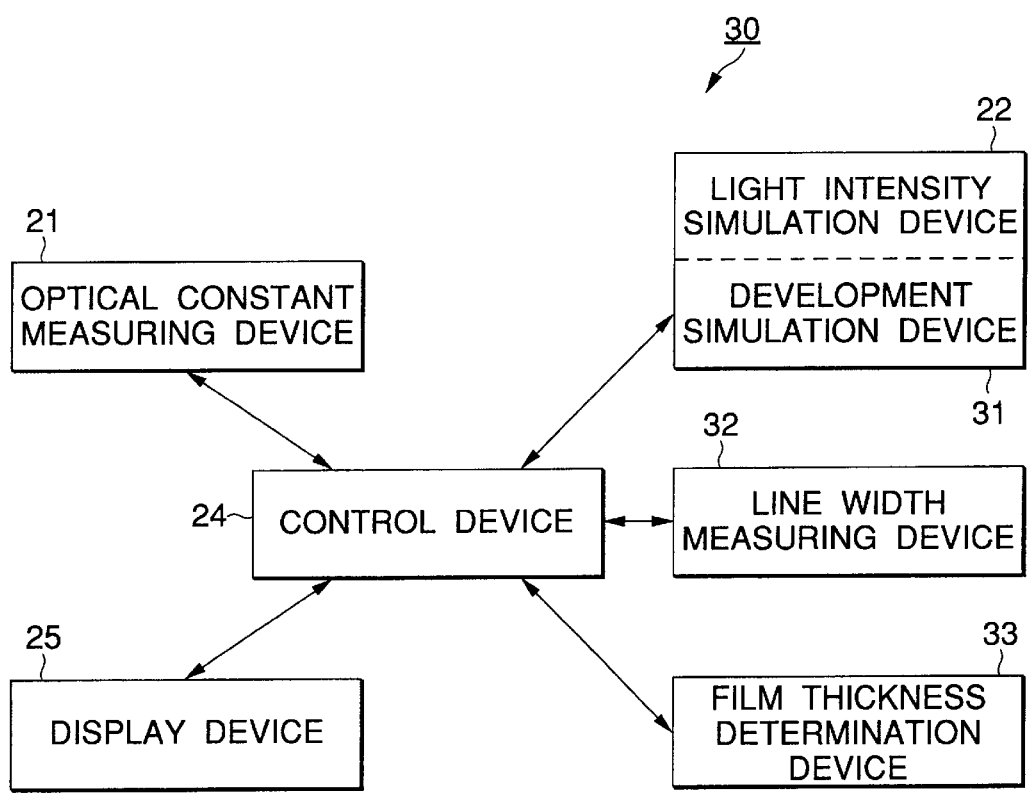
FIG. 10 is a block diagram showing another embodiment of the apparatus for optimizing a film thickness according to the invention.

FIG. 10 is a block diagram showing another embodiment of the apparatus for optimizing a film thickness according to the invention, where numeral 30 denotes the apparatus for optimizing a film thickness. The apparatus for optimizing a film thickness 30 is different from the apparatus for optimizing a film thickness 20 shown in FIG. 8 in that, in addition to the constitution of the apparatus for optimizing a film thickness 20, a development simulation device 31 conducting simulation of development using a result of the light intensity simulation device 22, and a line width measuring device 32 obtaining the line width of the resist at the interface between the film of a light reflecting material and the resist from the result of the simulation of development by the development simulation device 31 are provided; and a film thickness determination device 33 different from the film thickness determination device 23 is provided.

The development simulation device 31 comprises, as similar to the light intensity simulation device 22, a computer using the simulation program ("PROLITE 3D", a trade name), and is integrated into the light intensity simulation device 22.

The line width measuring device 32 is to obtain an objective line width from the discrete numerical data obtained from the result of the simulation of development. The measurement of the line width is specifically conducted by measuring, in the resist pattern (resist profile) shown in series of figures mentioned with a letter "B" among FIGS. 4A-1 through 7B-3, the width of the resist at the bottom part when the resist is a positive type, or the width of the space part between the resist when the resist is a negative type.

The measurements are conducted by numerical calculation. Values representing minute cells are calculated as data on calculation, and discrete data are stored. The data of cells in that the resist reaches development among all the cells are multiplied by the unit to calculate the line width.

The film thickness determination device 33 is to obtain the median between the maximum value and the minimum value of the line width obtained by the line width measuring device 32, and to determine the optimum film thickness of the film of a light reflecting material 12 by which the line width becomes the median. The film thickness determination device 33 comprises a computer having a program conducting such calculation.

Figure 11:
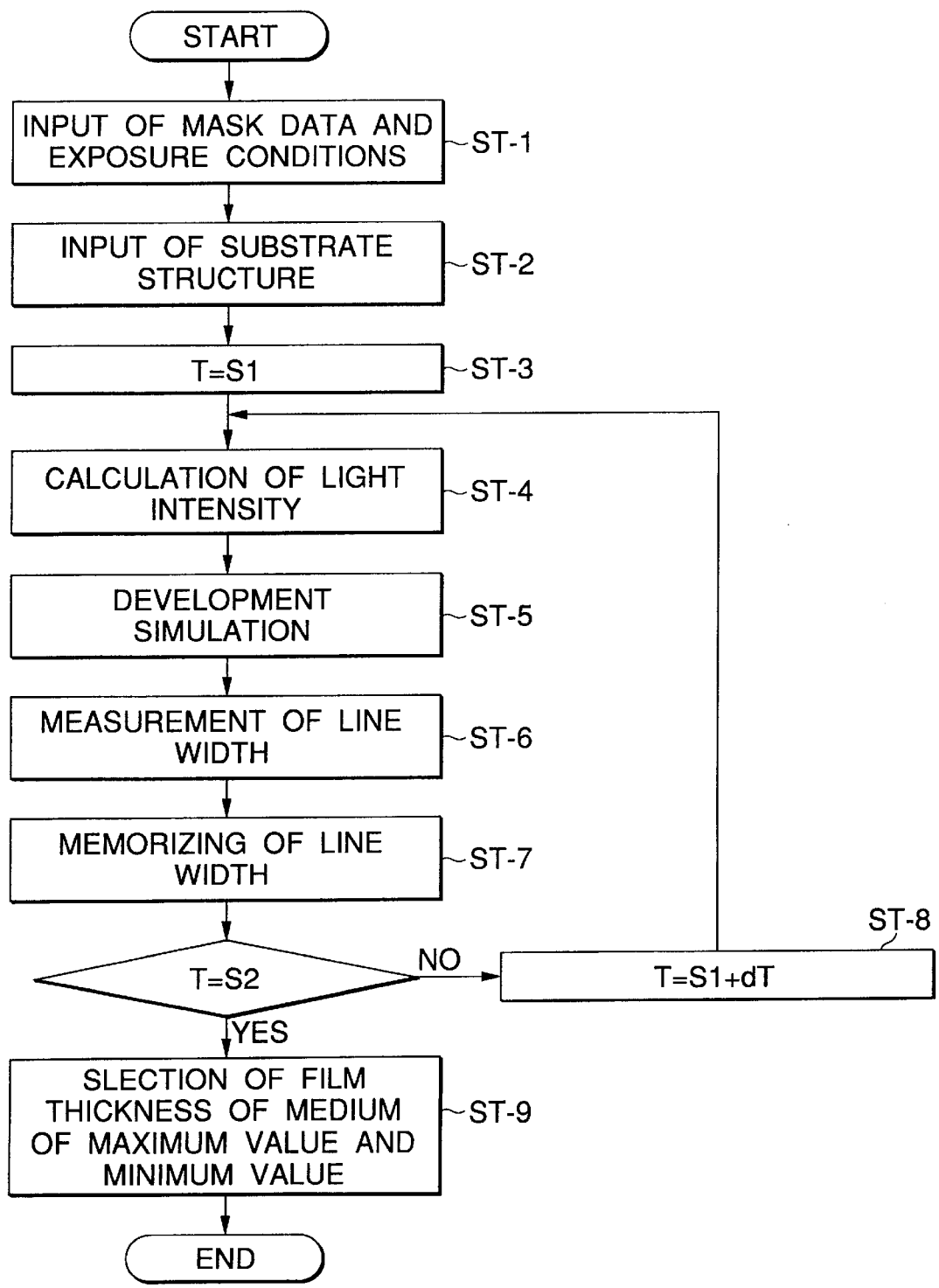
FIG. 11 is a flow diagram for explaining another embodiment of the process for optimizing a film thickness according to the invention using the apparatus for optimizing a film thickness shown in FIG. 10.

Based on the method for using the apparatus for optimizing a film thickness 30, another embodiment of the process for optimizing a film thickness of the invention is described by referring to the flow diagram of FIG. 11.

As similar to the embodiment shown by the flow diagram of FIG. 9, the mask data and exposure conditions (wavelength of light, NA and σ) for patterning the positive resist layer 13 are newly inputted to the light intensity simulation device 22, or selected from the data previously prepared to input to the light intensity simulation device 22 (ST-1). The structure of the substrate to be calculated is also inputted to the light intensity simulation device 22 (ST-2). The inputted data are the same as in the example shown by the flow diagram of FIG. 7.

After inputting the values, the film thickness T is set to S1 in the light intensity simulation device 22 (ST-3), and the calculation of the light intensity is conducted by using the set value (ST-4). The simulation of development is conducted based on the calculation result of the light intensity by the development simulation device 31, to make the resist pattern (resist profile) shown in the series of figures mentioned with a letter "B" among FIGS. 4A-1 through 7B-3 (ST-5).

The line width at the objective position is measured by the line width measuring device 32 from the resist profile, i.e., the discrete numerical data, obtained by the development simulation device 22 (ST-6), and the result (line width) is memorized (ST-7).

In the case where the film thickness T set in ST-3 is different from the final value S2, the increment value dT is added to the set value (ST-8) to obtain a new set value, and the calculation of the light intensity (ST-4), the simulation of development (ST-5), the measurement of the line width (ST-6) and the memorizing of the results (ST-7) are conducted using the new set value.

ST-4, ST-5, ST-6 and ST-7 are repeated until the film thickness T agrees with the final value S2, and after agreeing therewith, the minimum value, the maximum value and the median are obtained from the line width memorized in ST-7 by the film thickness determination device 33, and the optimum film thickness of the film of a light reflecting material 12, by which the line width becomes the median, is determined (ST-9).

While the optimum film thickness of the film of a light reflecting material can be determined in the invention, it is preferred that the unevenness of the film thickness within the surface of a wafer is 20 nm or less.

It has been found, as a result of studies on the influence of the unevenness of the optical constants by the simulation of light intensity and the simulation of development, that when the unevenness of the refractive index n is within a range of 4%, the standing wave and the resist profile after development are not changed.

As described in the foregoing, the process for producing a semiconductor device according to the invention resides in the process for optimizing the film thickness of the film of a light reflecting material by the simulation of light intensity or the simulation of development, by which the desired shape of the resist pattern can be stably formed, and the optimization of the film thickness can be conducted in a short period of time without a large amount of cost, so that improvement in productivity and reduction in production cost can be realized.

According to the apparatus for optimizing a film thickness and the process for optimizing a film thickness according to the invention, the process for producing a semiconductor device of the invention can be realized easily and reliability.

What is claimed is:

1. A process for producing a semiconductor device, comprising the steps of:

conducting a computerized simulation of light intensity using optical constants of a semiconductor substrate, a film of a light reflecting material, and a positive resist, while inputting a plurality of values for film thicknesses of said film of a light reflecting material, to determine an optimal thickness of said film of a light reflecting material that corresponds to a minimum absorption energy at an interface between said film of a light reflecting material and said resist;

forming said film of a light reflecting material at said optimal thickness on said semiconductor substrate;

coating said positive resist on said film of a light reflecting material;

forming a resist pattern from said positive resist; and etching said film of a light reflecting material using said resist pattern as a mask, wherein said optical constants of said semiconductor substrate, said film of a light reflecting material and said resist are obtained by measuring said optical constants thereof, or when optical constants thereof are known, by using said known optical constants.

2. A process for producing a semiconductor device, comprising the steps of:

conducting a computerized simulation of light intensity using optical constants of a semiconductor substrate, a film of a light reflecting material, and a positive resist, while inputting a plurality of values for film thicknesses of said film of a light reflecting material, to determine an optimal thickness of said film of a light reflecting material that corresponds to a maximum absorption energy at an interface between said film of a light reflecting material and said resist;

forming said film of a light reflecting material at said optimal thickness on said semiconductor substrate;

coating said positive resist on said film of a light reflecting material;

forming a resist pattern from said positive resist; and etching said film of a light reflecting material using said resist pattern as a mask, wherein said optical constants of said semiconductor substrate, said film of a light reflecting material and said resist are obtained by measuring said optical constants thereof, or when optical constants thereof are known, by using said known optical constants.

3. A process for producing a semiconductor device, comprising the steps of:

conducting a computerized simulation of light intensity using optical constants of a semiconductor substrate, a film of a light reflecting material, and a positive resist, while inputting a plurality of values for film thicknesses of said film of a light reflecting material;

conducting a computerized simulation of development using a result of said computerized simulation of light intensity to determine an optimal thickness of said film of a light reflecting material, at which a line width of said positive resist at an interface between said film of a light reflecting material and said resist is a median of a minimum value and a maximum value;

forming said film of a light reflecting material at said optimal thickness on said semiconductor substrate;

coating said positive resist on said film of a light reflecting material;

forming a resist pattern from said positive resist; and etching said film of a light reflecting material using said resist pattern as a mask, wherein said optical constants of said semiconductor substrate, said film of a light reflecting material and said resist are obtained by measuring said optical constants thereof, or when optical constants thereof are known, by using said known optical constants.

4. A process for optimizing a film thickness, comprising the steps of:

measuring optical constants of a semiconductor substrate, a film of a light reflecting material formed on said semiconductor substrate and a resist coated on said film of a light reflecting material;

conducting simulation of light intensity using said optical constants obtained, while varying a film thickness of said film of a light reflecting material to plural values; and obtaining an optimum film thickness of said film of a light reflecting material from a result of said simulation of light intensity.

5. A process for optimizing a film thickness, comprising the steps of:

measuring optical constants of a semiconductor substrate, a film of a light reflecting material formed on said semiconductor substrate and a resist coated on said film of a light reflecting material;

conducting simulation of light intensity using said optical constants obtained, while varying a film thickness of said film of a light reflecting material to plural values;

conducting simulation of development using a result of said simulation of light intensity; and obtaining an optimum film thickness of said film of a light reflecting material from a result of said simulation of development.

* * * * *